(12) United States Patent
Smith et al.

(10) Patent No.: US 6,420,266 B1
(45) Date of Patent: Jul. 16, 2002

(54) METHODS FOR CREATING ELEMENTS OF PREDETERMINED SHAPE AND APPARATUSES USING THESE ELEMENTS

(75) Inventors: John Stephen Smith, Berkeley; Mark A. Hadley, Newark; Jay Tu, Oakland, all of CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

(21) Appl. No.: 09/433,605

(22) Filed: Nov. 2, 1999

(51) Int. Cl.$^7$ .......................................... H07L 21/3065
(52) U.S. Cl. ...................... 438/692; 438/455; 438/459; 438/665; 438/666; 438/693; 156/655.1
(58) Field of Search ........................ 156/655.1; 438/455, 438/459, 665, 666, 692, 693

(56) References Cited

U.S. PATENT DOCUMENTS 5,545,291 A * 8/1996 Smith et al. ............. 156/655.1
5,958,794 A * 9/1999 Bruxvoort et al. .......... 438/692

* cited by examiner

*Primary Examiner*—Charles Bowers
*Assistant Examiner*—Lisa Kilday
(74) *Attorney, Agent, or Firm*—Blakely, Sokoloff, Taylor & Zafman LLP

(57) ABSTRACT

Methods for forming elements having a predetermined shape and for assembling the elements. In one example of a method, each of the elements includes a functional component which is disposed on a first face of a first substrate. A layer representing a first portion of the first substrate at a second face of the first substrate is removed, leaving a second portion of the first substrate on the first substrate. The second portion is etched through a first patterned mask on a surface of the second portion. The plurality of elements is then released from the first substrate. The plurality of elements may then be combined with a fluid to form a slurry. In another example of a method, the first face is etched vertically in regions adjacent to the edges of the plurality of elements, and regions below the first face are etched laterally, and then the plurality of elements are released from the substrate. Other methods of creating elements having a predetermined shape are described, and methods of using and/or assembling these elements are also described.

28 Claims, 13 Drawing Sheets

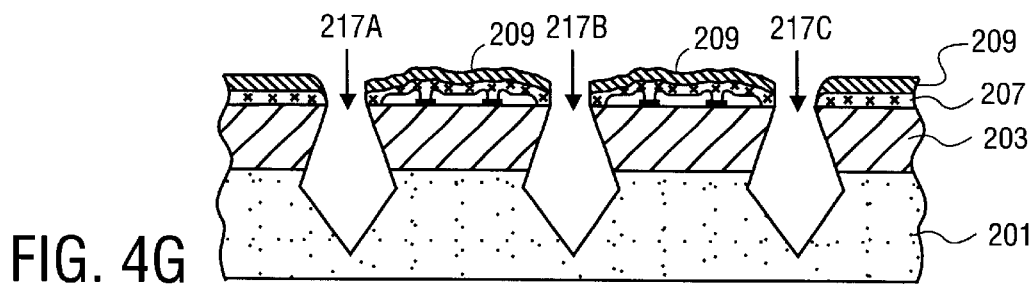
FIG. 4G
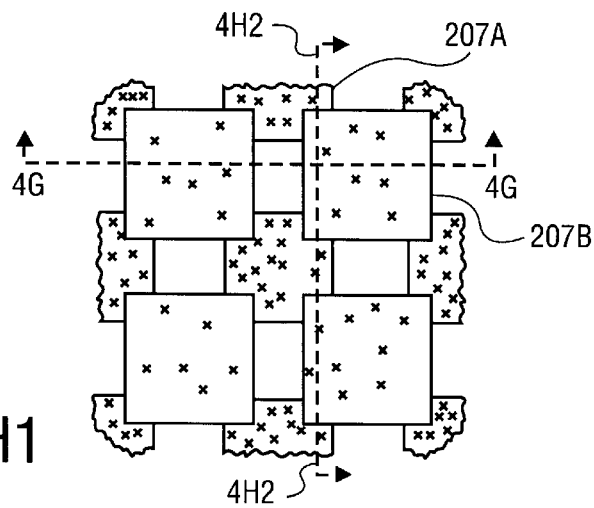
FIG. 4H1
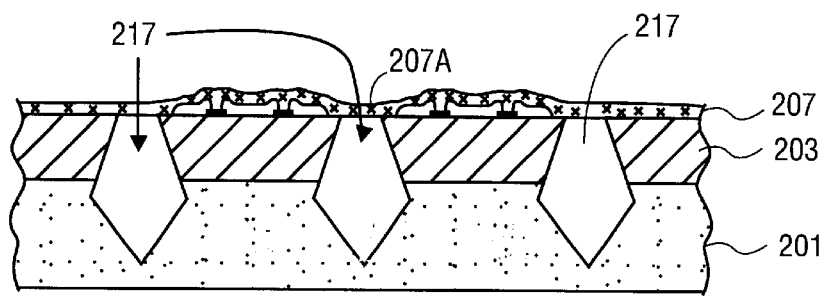
FIG. 4H2
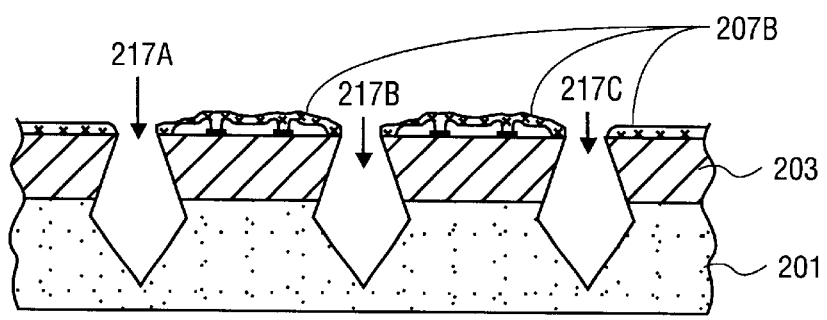
FIG. 4H3

METHODS FOR CREATING ELEMENTS OF PREDETERMINED SHAPE AND APPARATUSES USING THESE ELEMENTS

FIELD OF THE INVENTION

The present invention relates generally to the field of fabricating elements in one substrate, which elements are received by openings in a receiving substrate and also to apparatuses constituting or containing these elements.

BACKGROUND OF THE INVENTION

There are many examples of large arrays of functional components which can provide, produce or detect electromagnetic signals or chemicals or other characteristics. An example of such a large array is that of a display where many pixels or sub-pixels are formed with an array of electronic elements. For example, an active matrix liquid crystal display includes an array of many pixels or sub-pixels which are fabricated on amorphous silicon or polysilicon substrates which are large. As is well known in the art, it is difficult to produce a completely flawless active matrix liquid crystal display (LCD), when the display area is large, such as the LCD's on modem laptop computers. As the display area gets larger and larger, the yield of good displays decreases. This is due to the manner in which these display devices are fabricated.

Silicon VLSI can be used to produce such an array over a silicon wafer's surface, but silicon wafers are limited in size, limited in conductivity, and not transparent. Further, processing of large areas on silicon wafers can be expensive. Displays which valve the light coming through them need to be transparent. Single crystal silicon can be bonded to a glass substrate and then etched to remove most of the area to achieve transparency, but this is intrinsically wasteful in that, for the sake of maximizing light transmission, the majority of the processed material is discarded and becomes chemical waste. The under-utilization of the precious die area wastes resources, causes greater amounts of chemical waste to be generated in the process, and is generally inefficient and expensive. Another example is photodiode arrays which may be used to collect solar energy. Large arrays of silicon photodiodes with concentrating lenses have been made by sawing wafers and using a pick and place assembly, but thermal dissipation is poor for large elements, and the small elements require too much assembly time.

Alternative approaches to fabricating arrays such as displays include fabricating the desired circuitry in an amorphous or polycrystalline semiconductor layer which has been deposited on a substrate, such as glass or quartz. These approaches avoid the limitations of the size of the available single crystal silicon wafers, and avoid the cost of the single crystal wafers, but require expensive deposition of the semiconductor layer, and they still require processing of the entire large substrate to form the active elements in an array, still resulting in the production of much chemical waste and wasted resources. These processes also limit the choice of the substrate; for example, plastic substrates cannot be used due to the nature of the processes which deposit the semiconductor layers. Furthermore, amorphous or polycrystalline silicon semiconductor elements do not perform as well as those made from single crystal semiconductor material. For displays, as an example, it is often difficult or impossible to form some of the desired circuitry out of the amorphous or polycrystalline semiconductor materials. Thus, high frequency edge drivers may be impossible to form out of these materials. This results in the difficulty and expense of attaching an electrical lead for each and every row and column of an array, such as an active matrix liquid crystal display array.

As noted above, another difficulty with the existing techniques is that the large number of elements in a large array results in a low probability that all of them will work properly and thus the yield of acceptably good arrays from the manufacturing process is low. Furthermore, there is no possibility of testing any of the elements until the assembly is complete, and then any imperfection in the array must be tolerated or the entire array could be discarded or special and expensive techniques must be used to repair it. These problems result from the fact that the various elements in the array are fabricated on the array rather than separately.

It is possible to separately produce elements, such as pixel drivers and then place them where desired on a different and perhaps larger substrate. Prior techniques can be generally divided into two types: deterministic methods or random methods. Deterministic methods, such as pick and place, use a human or robot arm to pick each element and place it into its corresponding location in a different substrate. Pick and place methods place devices generally one at a time, and are generally not applicable to very small or numerous elements such as those needed for large arrays, such as an active matrix liquid crystal display. Random placement techniques are more effective and result in high yields if the elements to be placed have the right shape. U.S. Pat. No. 5,545,291 describes a method which uses random placement. In this method, microstructures are assembled onto a different substrate through fluid transport. This is sometimes referred to as fluidic self assembly. Using this technique, various blocks, each containing a functional component, may be fabricated on one substrate and then separated from that substrate and assembled onto a separate substrate through the fluidic self assembly process.

Thus the process which uses fluidic self assembly typically requires forming elements or blocks, each containing at least one functional component and each having a predetermined shape which is designed to fit into openings in a receiving substrate. Two methods are known in the prior art for forming such elements and are described in U.S. Pat. No. 5,545,291. One such method is shown in FIGS. 1A through 1F which show a cross-sectional view of a process of fabricating a plurality of blocks. The substrate 10 shown in cross-section view in FIG. 1A may be a gallium arsenide wafer. A sacrificial layer 12 is formed on the top of the substrate 10 as shown in FIG. 1B. This sacrificial layer may be formed by CVD (Chemical Vapor Deposition) or sputtering and may be formed from aluminum arsenide. Then an active layer from which the blocks will be created is deposited over the sacrificial layer 12. The active layer 14 is shown applied over the sacrificial layer 12 in FIG. 1C. A masking material is then applied over the active layer 14 and is patterned thereby creating the masks 16 as shown in FIG. 1D. Then an etching process is performed on the structure shown in FIG. 1D to etch away the active layer 14, except where masked, down to the sacrificial layer 12. This results in the structure shown in FIG. 1E in which the blocks 18A and 18B have been formed underneath the masks 16. The shaped blocks in this case include a trapezoidal profile or truncated pyramid shape which may be fabricated by methods of wet etching, plasma etching, ion milling, or reactive ion etching, depending on the materials and the application. The masked layer 16 may then be removed (e.g., by using a photoresist stripper if the masks are formed from developed photoresist) and then the sacrificial layer is preferentially etched (e.g., with a wet hydrofluoric acid etch depending on the materials used for the sacrificial layer relative to the materials used for the blocks). This causes the blocks 18A and 18B to be released. The blocks can then be collected and placed into a slurry such as a fluid for later use in the fluidic self assembly process or in other assembly processes.

FIGS. 2A through 2D show an alternative approach for fabricating elements or blocks which can be later assembled into openings in a receiving substrate. The method shown in FIGS. 2A through 2D begins with the structure of FIG. 1E by taking that structure and filling it, on the sides with the blocks, with a material such as a wax or other filler thereby producing the structure in FIG. 2A which is a cross-sectional view through the blocks and the substrate. A substrate 22, which may be a silicon wafer, may then be applied to the block side of the structure shown in FIG. 2A, which results in the structure shown in the cross-sectional view of FIG. 2B. Typically, the native oxide layer on the substrate 22 is removed from the face of the substrate before applying the substrate to the filler material 20 and the mask material 16. The top of the structure shown in FIG. 2B is then lapped in order to remove the substrate 10. In one embodiment, this top substrate layer is lapped up to 50 microns and then etched away up to the sacrificial layer 12 which acts as an etch stop. In one particular embodiment, this etch may be a hydrogen peroxide and ammonium hydroxide etchant. Following this etch, the sacrificial layer which in one embodiment is an aluminum arsenide layer is removed thereby producing the structure shown in FIG. 2C, which is a cross-sectional view. Then the filler material 20 and the photoresist material 16, which is used as a mask, is dissolved away in order to release the blocks 18B and 18A.

While the foregoing methods allow for the creation of blocks, these methods do not easily produce precisely formed blocks, and particularly precisely formed sidewalls of the blocks.

SUMMARY OF THE INVENTION

The present invention provides methods for creating elements of a redetermined shape which are designed to fit into openings in a receiving substrate. In one example of a method of the present invention, a plurality of functional components in a plurality of elements are fabricated in a first substrate. The functional components are disposed on a first face of the first substrate, which includes the first face and a second face. A layer representing a first portion of the first substrate at the second face is removed to leave a second portion of the first substrate. The second portion of the first substrate is etched through a first patterned mask on a surface of the second portion, and the plurality of elements is released from the first substrate. In one particular example of the present invention according to this method, the plurality of elements once released are combined with a fluid to form a slurry which may then be applied over a substrate which includes openings to receive the elements.

In another example of a method according to the present invention, a plurality of functional components and a plurality of elements is fabricated in a first substrate which includes a first face and a second face, wherein the plurality of functional components are disposed on the first face of the substrate. Regions of the first face which are adjacent to the edges of the plurality of components are etched vertically. Regions below the first face which are adjacent to the edges are etched laterally, and the plurality of elements is released from the first substrate. In one particular specific example of this method, the vertical etch is performed with a reactive ion etch, and the lateral etch is an undercutting etch.

According to another example of a method of the present invention, a tungsten layer is deposited on a first face which includes a plurality of functional components in a plurality of elements which are fabricated in the first substrate which includes the first face. A second face of the first substrate is etched to expose at least a portion of the plurality of elements, and then the layer including tungsten is etched. In one particular specific embodiment according to this method, the etching of the tungsten layer releases the plurality of elements from the first substrate.

In another example of a method according to the present invention, a structure may be assembled on a receiving substrate by dispensing the slurry over the receiving substrate which includes a plurality of openings. This slurry includes a fluid and a plurality of shaped elements, where the shaped elements have been fabricated according to one of the methods of the present invention.

Other aspects and methods of the present invention as well as apparatuses formed using these methods are described further below in conjunction with the following figures.

BRIEF DESCRIPTION OF THE DRAWINGS

The present invention is illustrated by way of example and not limitation in the figures of the accompanying drawings in which like references indicate similar elements. Note that the following figures are not necessarily drawn to scale.

FIGS. 4A through 4K show another example according to the present invention for creating a plurality of elements having a predetermined shape which are designed to be received by openings in a receiving substrate. FIGS. 4A, 4B, 4C, 4D, 4E1, 4E3, 4F, 4G, 4H2, 4H3, 4I, 4J, and 4K show cross-sectional views after various processing operations according to the invention. FIGS. 4E2 and 4H1 show top views of two structures after certain processing operations according to the present invention.

DETAILED DESCRIPTION

Figure 1A:
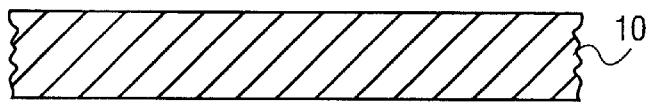
FIGS. 1A through 1F show in cross-sectional views one method for forming shaped blocks according to the prior art.
Figure 1B:
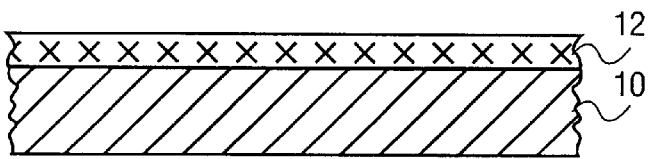
Figure 1C:
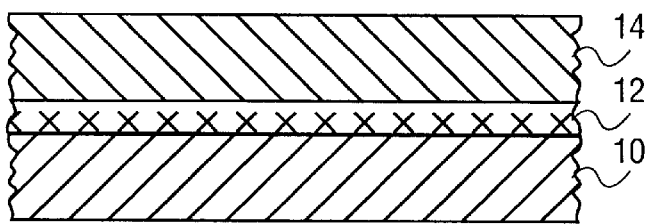
Figure 1D:
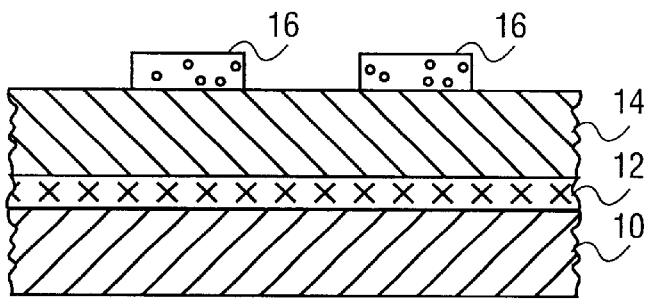
Figure 1E:
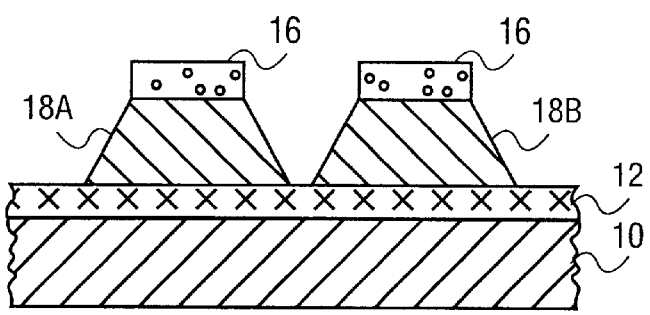
Figure 1F:
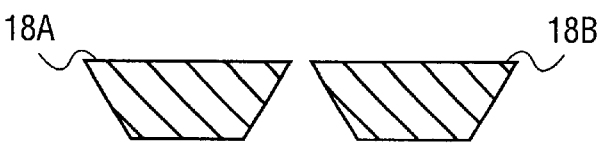
Figure 2A:
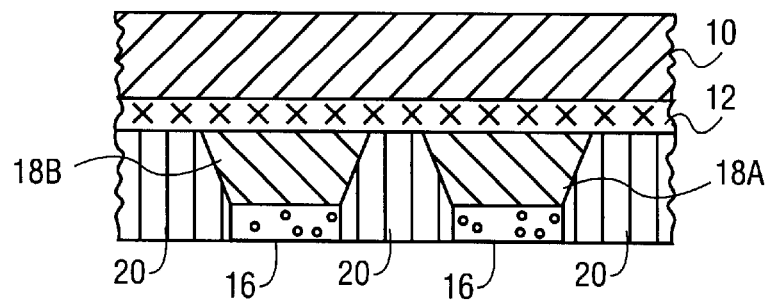
FIGS. 2A through 2D show cross-sectional views of another method for forming shaped blocks which are designed to fit in openings in a receiving substrate according to one method of the prior art.
Figure 2B:
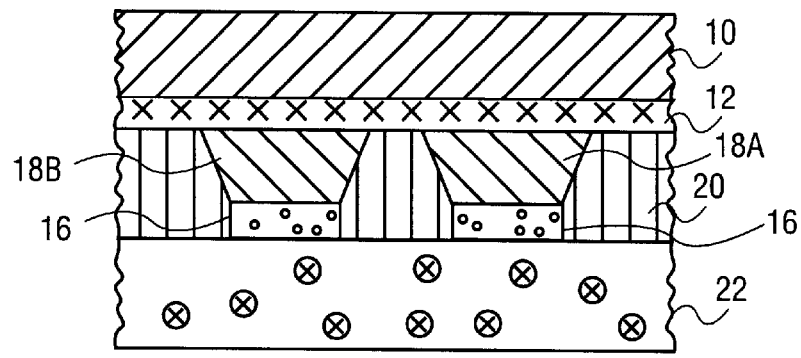
Figure 2C:
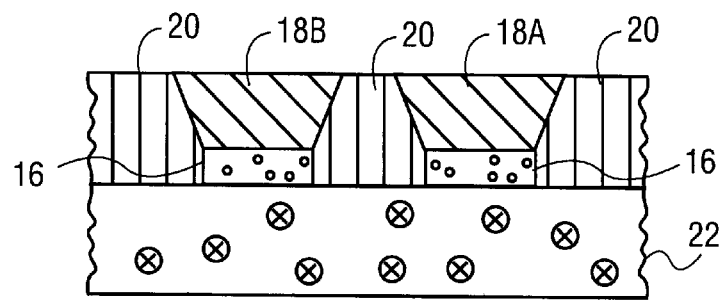
Figure 2D:
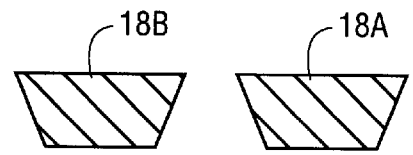

The present invention provides for methods for forming a plurality of elements each having a predetermined shape, which elements are designed to be received by openings in a receiving substrate. The following description and drawings are illustrative of the invention and are not to be construed as limiting the invention. Numerous specific details are described to provide a thorough understanding of the present invention. However, in certain instances, well known or conventional details are not described in order to not unnecessarily obscure the present invention in detail.

The present invention relates generally to the field of creating elements which are designed to be received in openings in a receiving substrate, and the present invention also relates to apparatus which are these elements and to assemblies in which the elements have been placed into these openings. The present invention may be used to fabricate elements for various different types of arrays. Typically, each element in the array includes a functional component which may be an electrical component, a chemical component, or an electromechanical structural element which may be a micro-electro-mechanical structural element (MEMS). The various methods of the present invention are illustrated in certain detailed examples with regard to the manufacture of an active matrix liquid crystal display, but it will be recognized that the invention will have wider applicability. Merely by way of example, the invention may be applied to the fabrication of an electronic array which can be used to deliver precise voltages for the control of liquid crystal cells to create a liquid crystal display or may be used for other types of displays such as electro-luminescent displays or light emitting diode displays and also for other applications requiring sampling or producing electrical signals over a large array of electrodes, such as memories and imaging arrays and photodiode arrays. Further, the present invention may be used to create an array of electromagnetic signal detectors, or solar cells, or MEMS or chemical sensors.

FIGS. 3A through 3G illustrate an example of a preferred method according to the present invention. A substrate 101, such as a silicon wafer formed from mono-crystalline silicon, is used to fabricate a plurality of elements each having at least one functional component in the element. In one particular example, each element is a pixel driving circuit for a pixel in an active matrix liquid crystal display. Each of these elements are fabricated in a top face of the silicon wafer and are shown as elements 103A, 103B, and 103C which are disposed in a top face of the substrate 101 (shown upside down in FIG. 3A). Typically, a passivation layer 102 is applied above the fabricated elements in the conventional manner for forming passivation layers over integrated circuits. Optionally, a tungsten layer (or a titanium tungsten layer) may also be provided on top of the layer 102 such that the tungsten layer covers the passivation layer which itself covers the plurality of elements disposed in the first face of the substrate 101. The tungsten layer (or other materials such as titanium tungsten) may be considered a release layer which is used to hold the blocks until the final stages of processing and then is used to release the blocks; other materials which may be used as a release layer will depend on the composition of the adjoining layers and will be appreciated to be within the scope of this aspect of the invention. It will be appreciated that each of elements (103A, 103B and 103C) includes conventional bonding pads which are used to make electrical contact with the electrical circuits in the element. The surface of the circuit is preferably covered with a thick silicon dioxide passivation layer, preferably about two thousand to eight thousand angstroms thick except for the contact area of the bonding pads (also referred to as contact pads). The surface is then encapsulated with a thin passivation layer such as silicon nitride to protect the bonding pads during subsequent processing, with the preferred layer being silicon nitride which is resistant to KOH etching. The thickness of this mask is preferably between one hundred and one thousand angstroms. The passivation layer 102 shown in FIG. 3A thus may represent the combined silicon dioxide and silicon nitride passivation layer or may represent other combinations of passivation layers and dielectric layers (which may be etched in a later step) and may include tungsten, for example, where the tungsten layer is the top most surface on the wafer.

The front side of the resulting wafer (the side of the wafer bearing the circuitry) is then bonding to an ultra-flat silicon handler wafer 106 which includes an adhesive layer such as a uniform thin film hydrocarbon based adhesive or a positive or negative photoresist layer 104. Preferably, the substrate 106 as noted above is an ultra-flat silicon wafer having a total thickness variation of less than 2 microns and preferably less than a half a micron. In one embodiment, the adhesive is uncured negative photoresist such as OSC SC resist, which is spincoated onto one or preferably both of the wafers to achieve a thin, uniform thickness adhesive layer. Other adhesives will also serve as effective bonding agents, provided that they can be applied to the wafers to yield a uniform thickness adhesive coating. The coated wafers are then pressed together and preferably heated to bond the wafer 101 to the ultra-flat wafer 106.

Figure 3A:
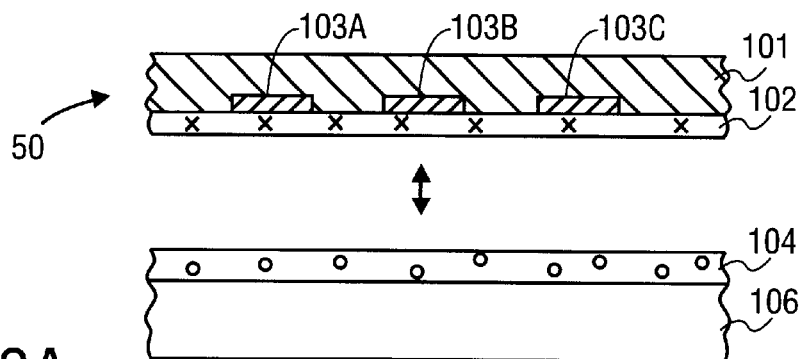
FIGS. 3A through 3G show in cross-sectional views one example of a method of the present invention for forming elements having a predetermined shape which are designed to be received by openings in a receiving substrate.
Figure 3B:
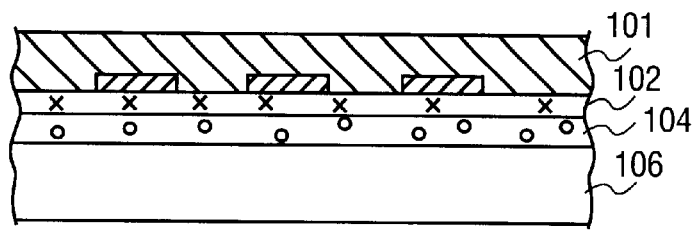
Figure 3C:
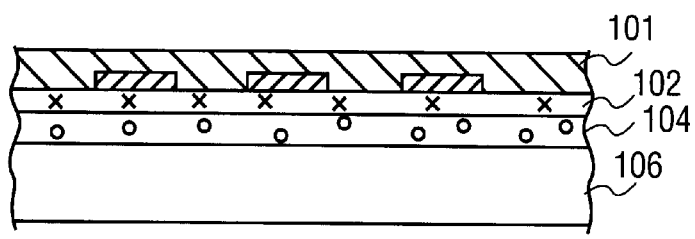
Figure 3D:
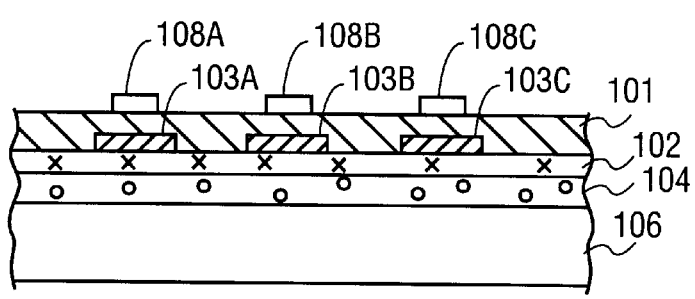
Figure 3E:
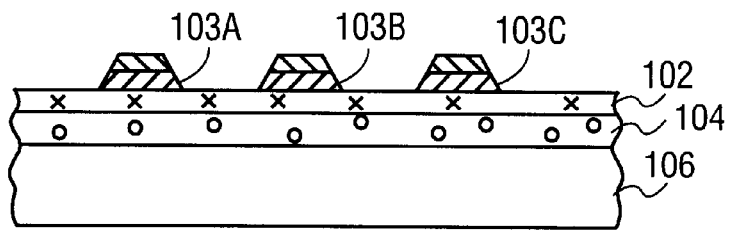
Figure 3F:
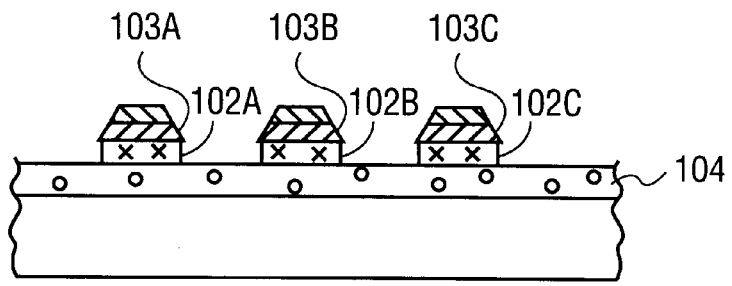

After bonding the resulting structure is shown in FIG. 3B in which the wafer 101 is bonded to the handler wafer 106. Then the backside of the wafer 101 is ground and polished to the desired block thickness to yield a bonded layer pair with a total thickness variation of less than two microns and preferably less than a half a micron. The backside of the wafer is then coated with an effective KOH etch barrier, such as a plasmapolymerized hexane (PPH). The PPH layer is patterned with reference to the circuits on the front side using standard backside alignment lithography techniques. After lithography, the resulting structure is shown in FIG. 3D in which the patterned KOH etch barrier is shown as barriers 108A, 108B, and 108C. These are disposed on the backside lapped surface of the wafer 101 as shown in FIG. 3D.

Figure 3G:
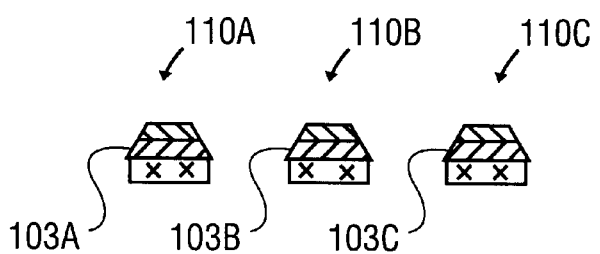
Figure 3H:
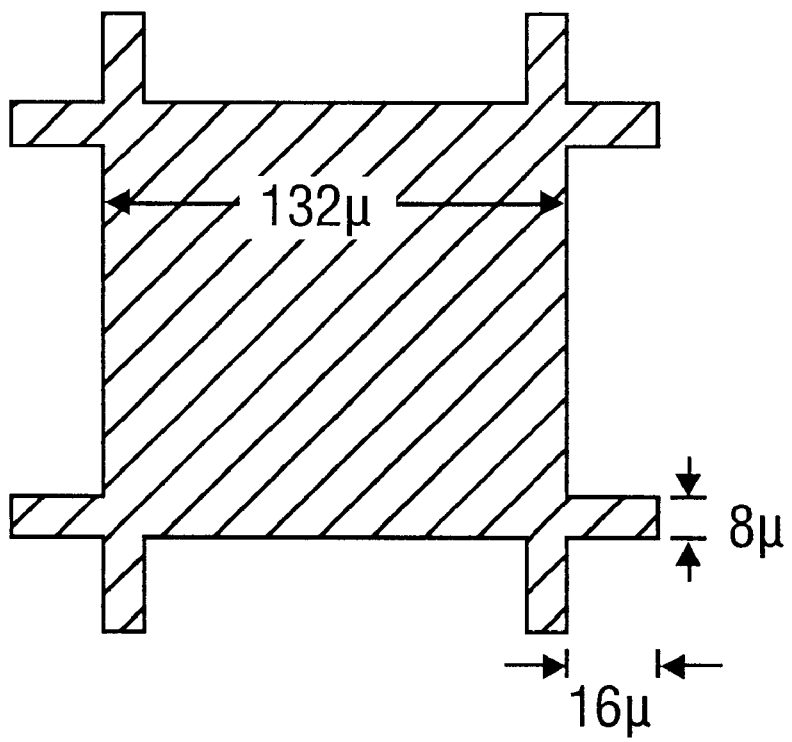
FIGS. 3H and 3I show a mask shape and a resulting block, respectively.
Figure 3I:
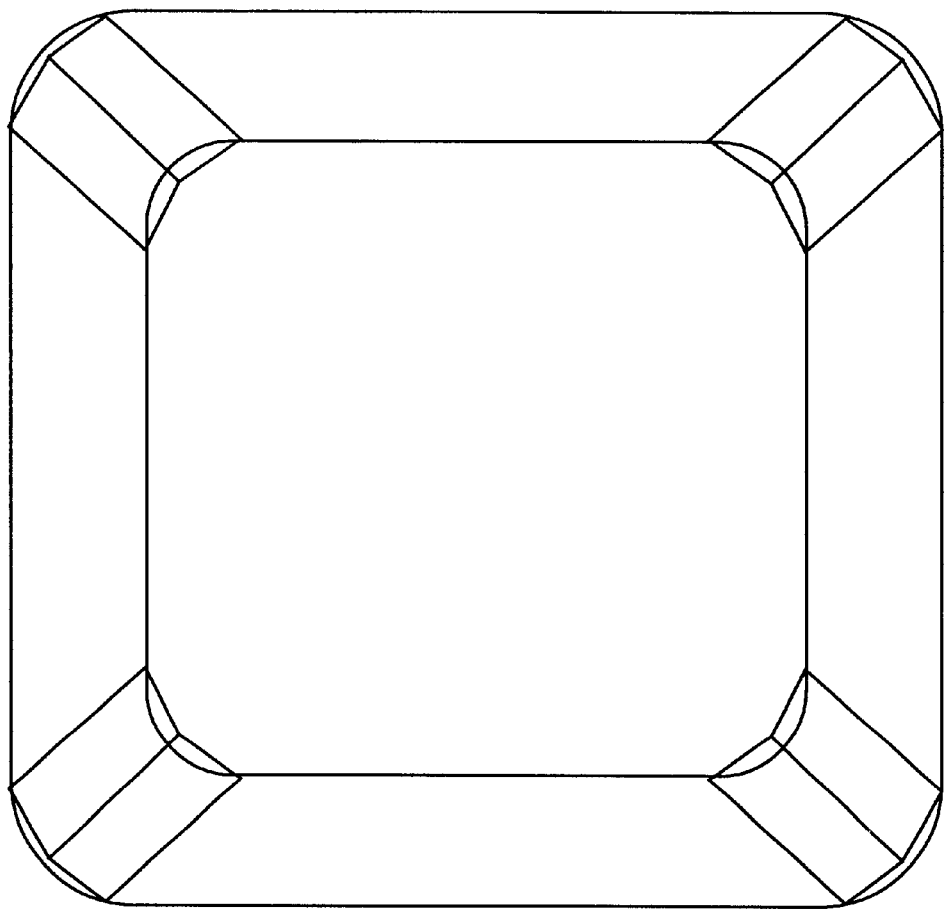
Figure 5A:
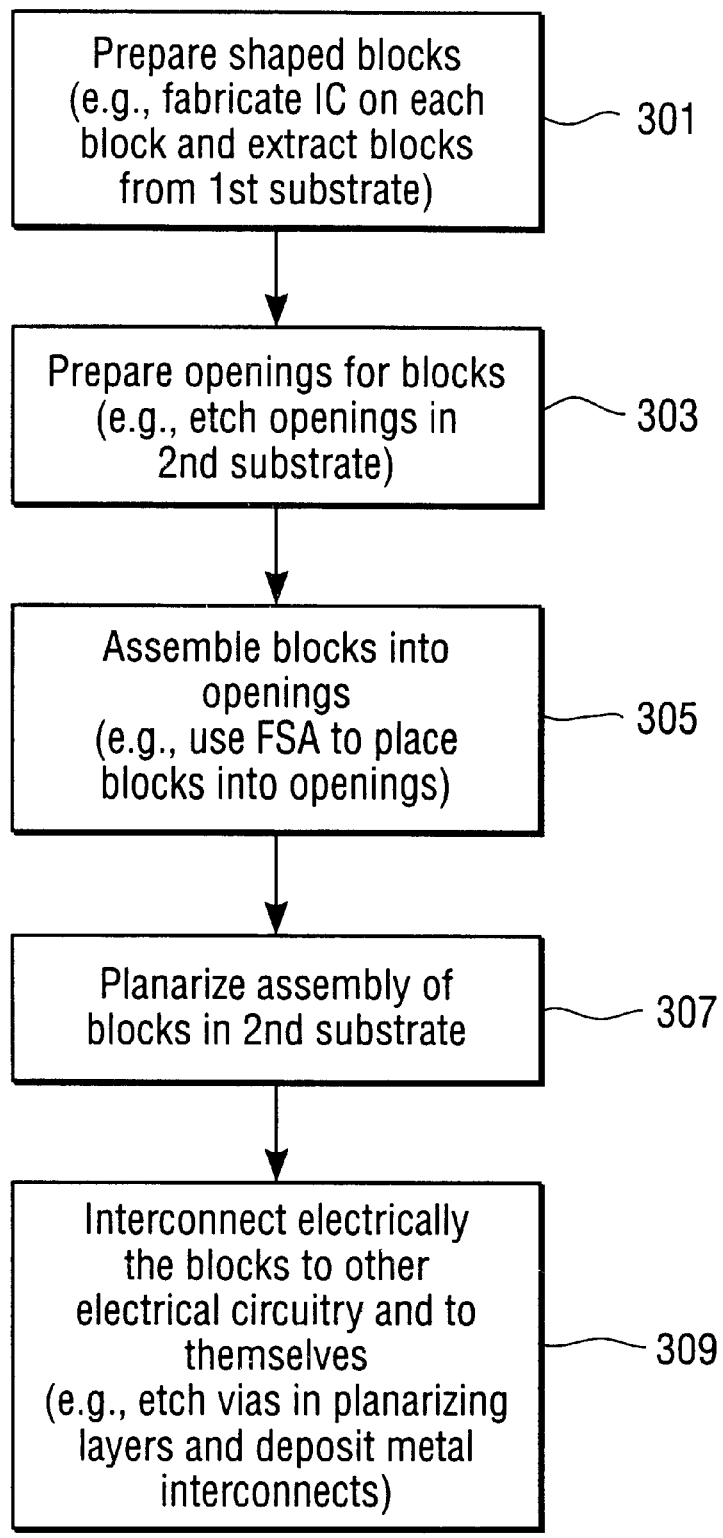
FIGS. 5A is a flowchart which illustrates a generalized method of forming an assembly of shaped blocks which are designed to be received by openings in a receiving substrate in order to create a final assembled structure.
Figure 5B:
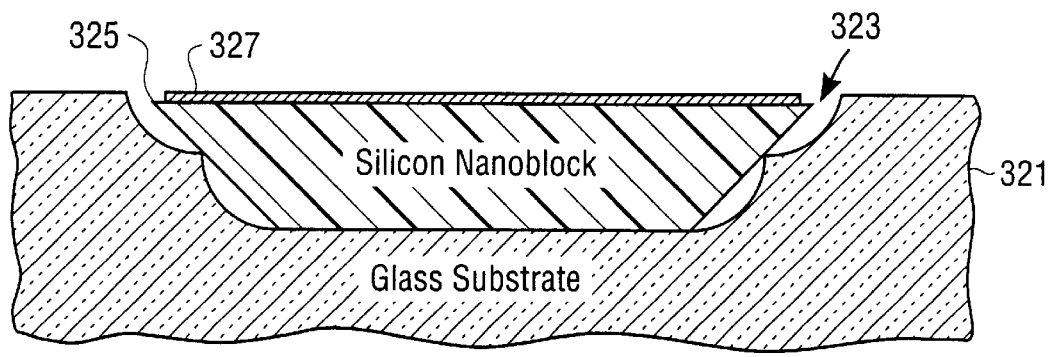
FIGS. 5B, 5C, and 5D show in cross-sectional views a particular example of an assembly process according to the present invention.
Figure 5C:
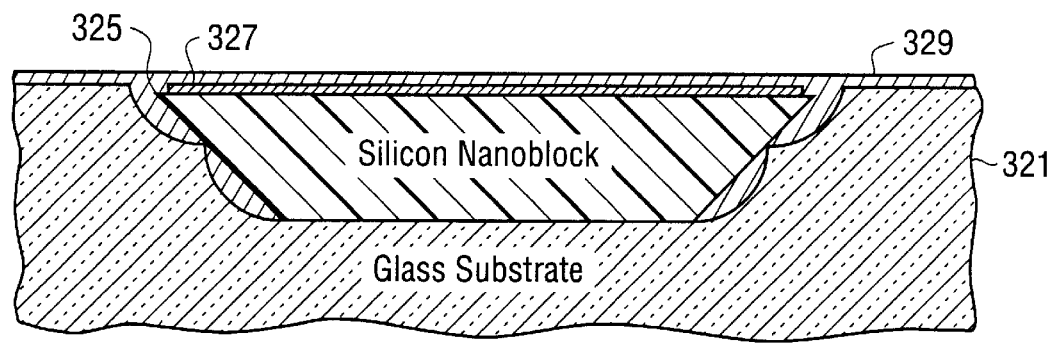
Figure 5D:
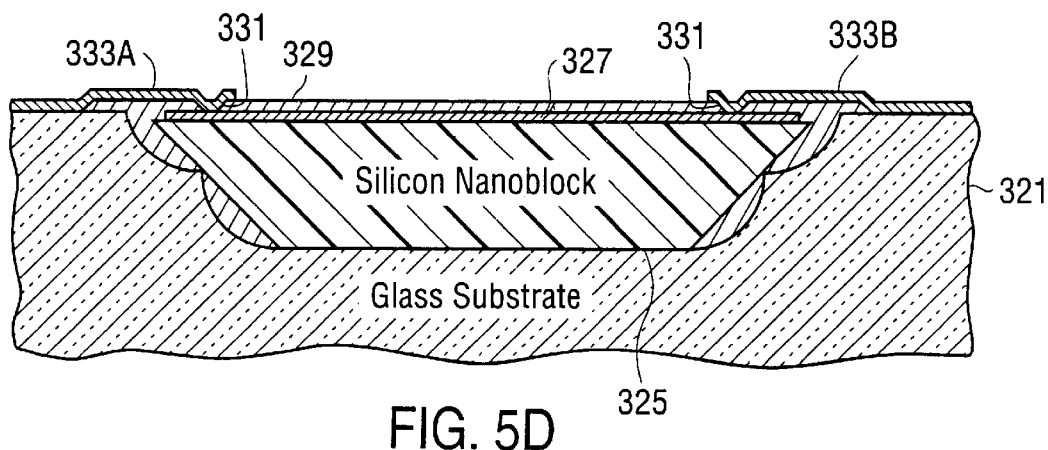

In a preferred embodiment, the mask which is used to create the barriers 108A, 108B, and 108C includes regions which are designed to prevent rounding of the corners of the blocks. The KOH etch, which follows the formation of the barriers 108A, 108B and 108C, attacks the corners of the blocks faster than the edges (which are normally 111 planes). If a simple square mask was used to mask the PPH layer in order to generate the patterned KOH etch barriers, then the corners of the resulting blocks would be rounded. In order to reduce corner rounding, "ears" are included on the corners of the mask which is used to generate the patterned KOH etch barrier. The "ears" on the mask produce protrusions on the barriers which protect the corners of each block during the KOH etch. An example of a mask shape for a patterned KOH etch barrier is shown in FIG. 3H. The dimensions shown on FIG. 3H for this mask shape are designed to produce a block having a cross-section which is similar to the cross-section of the silicon nanoblock shown in FIG. 5B and having the following dimensions: a bottom width of about 131 microns, a top width of about 182 microns, a total thickness of about 38 microns, circuit layer thickness of about 2 microns and corner angles of about 54.7 degrees. Each corner has two angles as shown in FIG. 3I. FIG. 3I shows a top view of such a block. It will be appreciated that this block represents one of many different examples and sizes of blocks.

With the KOH etch barrier mask in place, the wafer 101 is etched from the backside with an etch that is selective to the crystal plane orientation, with the [111] plane having the slowest etch rate. The etch mixture can be KOH-based or more preferably KOH-based solution with excess isopropanol at 70° C., or most preferably KOH-based solution with excess isopropanol at 70° C. and oxidizing agents such as sodium peroxydisulfate, sodium periodate, or gaseous, bubbled molecular oxygen. The KOH solution may be 4 parts $H_2O$ and 1 part KOH (by weight). This etch with the KOH etch barrier in place is continued until the silicon between the blocks 103A, 103B, and 103C is removed, yielding trapezoidal blocks that are still bonded to the handle wafer 106. This produces the structure shown in the cross-section view of FIG. 3E. The blocks are then released by first etching the oxide and nitride layers between the blocks with a fluorine-based aqueous or plasma etch. This results in the structure shown in FIG. 3F. Then the bonding layer is removed with a solvent or stripping solution which strips or removes the photoresist layer 104. In an alternative embodiment, if the top layer of the wafer assembly 50 shown in FIG. 3A is a tungsten layer, then the tungsten layer may be removed by a wet etch in a hydrogen peroxide solution. The freed/released blocks are then collected in a sieve and stored in a water or solvent-based slurry and are shown in FIG. 3G.

Another example of a method according to the present invention will now be described by referring to FIGS. 4A through 4K. This method begins with a substrate 201 onto which an epitaxial layer 203 is deposited. In one particular example of this method, the substrate 201 may be heavily doped P-type silicon wafer, and the epitaxial layer may be a lightly doped P-type or N-type epitaxial layer which is one to one hundred microns thick. Alternatively, a moderately doped P-type silicon wafer may be first covered by a heavily doped P-type epitaxial layer which is a few microns thick which is then covered by a lightly doped P-type epitaxial layer. The thickness of the top epitaxial layer will determine the thickness of the separated blocks that will be formed. Typically, the block thickness is preferably one third to sixth of the linear size of the circuit, and most preferably one fourth to one fifth of the linear size of the circuit on each block.

Figure 4A:
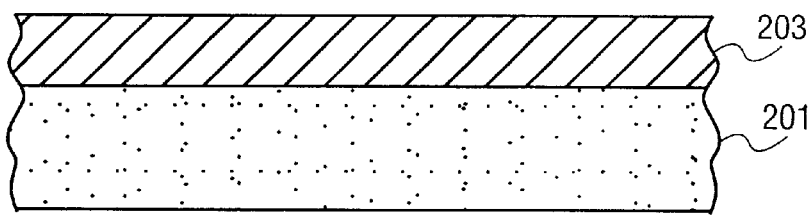
Figure 4B:
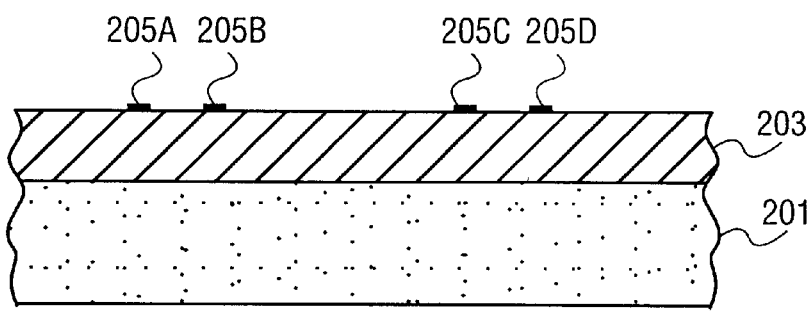
Figure 4C:
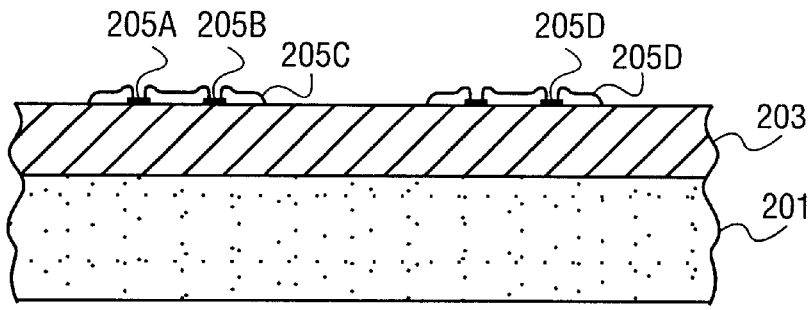
Figure 4D:
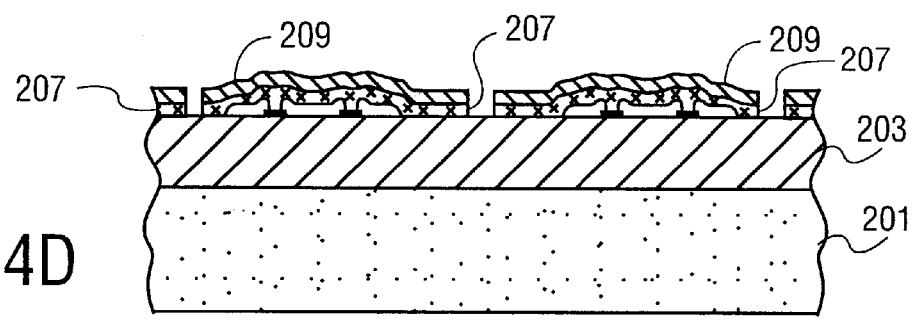
Figure 4F:
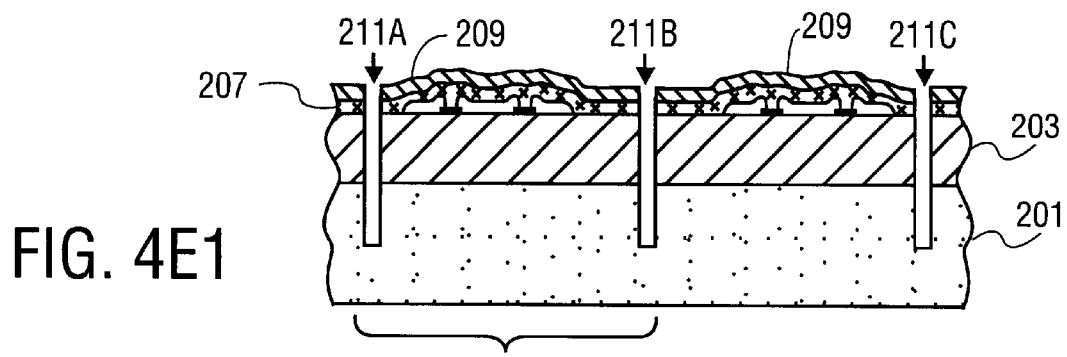
Figure 4F:
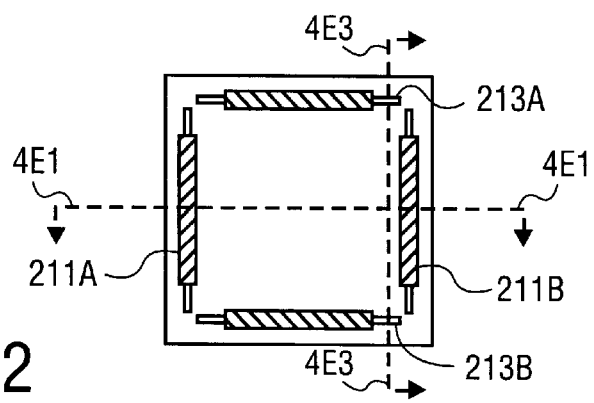
Figure 4F:
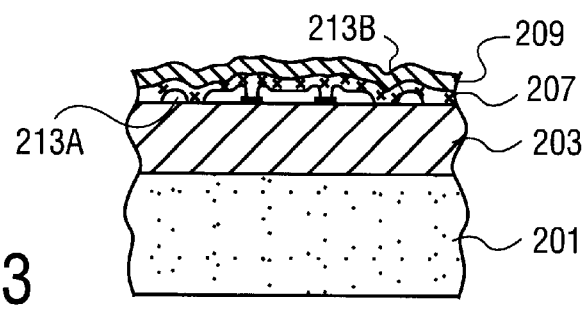
Figure 4F:
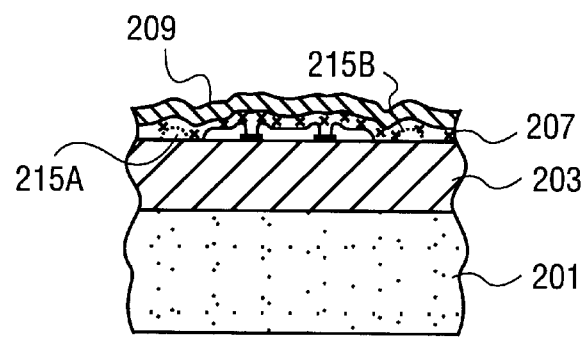
Figure 4I:
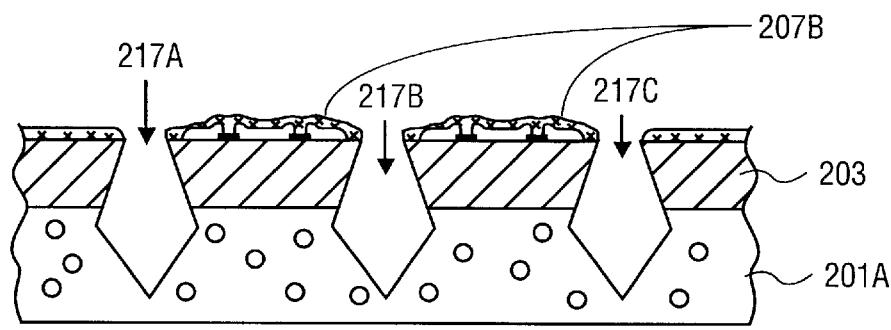

The circuits are then fabricated using conventional techniques into the top surface of the epitaxial layer 203 and contact pads are also fabricated onto the surface of the epitaxial layer 203 as shown in FIG. 4B which shows four contact pads 205A, 205B, 205C, and 205D which are coupled to circuits (not shown) in the epitaxial layer. Then a thick passivation layer, such as a silicon dioxide layer is applied and patterned over the surface of the epitaxial layer 203. The pattern in the passivation layer is such that in regions between the blocks, there is no passivation material and the passivation material over the contact pads has been removed by creating a via in the passivation layer as shown in FIG. 4C. In particular, two regions of passivation 205C and 205D are disposed above the two regions where two blocks will be created. In one embodiment, the passivation layer is a thick silicon dioxide layer of about 2000 angstroms thick. While it is not shown in FIG. 4C, this silicon dioxide passivation layer is also patterned into a fuse region shown as regions 213A and 213B in the cross-sectional view of FIG. 4E3. After the passivation layer has been applied and patterned over the contact pads as shown in FIG. 4C, an encapsulation layer is then deposited over the entire substrate covering the previously deposited passivation layer as well as the exposed surface of the epitaxial layer 203 between the blocks to be formed. An example of this encapsulation layer is a silicon nitride material 207 shown in FIG. 4D which is resistant to a selected etch such as a KOH etch. In one example, this encapsulation material is a silicon nitride material having a thickness of one hundred to a thousand angstroms, preferably four hundred angstroms. Care should be taken to assure that the encapsulating material forms a seal with the silicon surface to prevent attack of any of the encapsulated circuits or their dielectric layers. The encapsulating layer is then patterned to form openings in the layer 207 as shown in FIG. 4D. Then another layer is applied and patterned which layer is resistant to a reactive ion etch. In one example, a photoresist may be used as this material, and the photoresist is applied and patterned as the layer 209 as shown in FIG. 4D. Note that the openings in the layer 209 coincide with the openings in the layer 207 and expose regions of the surface of the epitaxial layer 203 which will be attacked by a vertical reactive ion etch to produce the trenches 211A, 211B, and 211C as shown in FIG. 4E1. FIG. 4E2 shows a top view around one rectangular block which shows the vertical trenches 211A and 211B and two other vertical trenches arranged at 90° relative to the other two trenches to create four vertical cuts which substantially define the rectangular shape of this block. FIG. 4E2 also shows the cross-sectional view of FIG. 4E1 which cuts through the two trenches 211A and 211B. FIG. 4E2 also shows the cut taken from the cross-sectional view for FIG. 4E3; this view of FIG. 4E3 is through a portion of the substrate which has not been cut by the vertical trenching. Note that the vertical trenching does not extend to the corners of the blocks. That is, the openings for the vertical trenches formed by the masks created by patterned layers 207 and 209 and also the resulting trenches extend along only a portion of each rectangular side of a block. Similarly, the fuse regions 213A and 213B, which are in one embodiment silicon dioxide "fingers" extending along the top surface of the epitaxial layer 203, also do not extend to the corners of the blocks. This can be seen from FIG. 4E2 which shows a top view of these fuse regions 213A and 213B which are also shown in cross-sectional view in FIG. 4E3. The reactive ion vertical etch which creates the trenches 211A, 211B, and 211C is typically performed entirely through the epitaxial layer 203 and continues to a depth in one embodiment of at least twice the epitaxial layer thickness. In one embodiment, this reactive ion etch may be performed in a process available commercially from Surface Technology Systems of South Wales, United Kingdom. This reactive ion etch has an aspect ratio of better than 50:1. The wafer is then etched in a liquid etchant, preferably hydrofluoric acid, which preferentially removes the silicon dioxide regions 213A and 213B. The resulting wafer is shown in cross-sectional view in FIG. 4F, which cross-sectional view is taken at the same cut as FIG. 4E3.

At this point in the process, the assembly is now ready for a selective crystal orientation etch. In one embodiment this is performed by placing the assembly into a wet KOH etch. Alternatively, the etchant may be EPD which has been described in U.S. Pat. No. 5,545,291. This etchant enters the trenches 211A, 211B, and 211C and also enters the fuse regions 215A and 215B (shown in FIG. 4F) and etches away selectively depending upon the crystal orientation of the silicon material, preferably slowest in the [111] direction. The etch is continued until the diamond cross-sectioned shape trenches 217A, 217B, and 217C are completed, and the etches are stopped before the corner where the trenches meet is substantially rounded. Note that the length of the fuse regions 213A and 213B is picked such that the selective etch reaches the corners at the same time that the trench is completed. The resulting structure is shown in FIG. 4G which is a cross-sectional view through the same section of the block as FIG. 4E1.

Figure 4J:
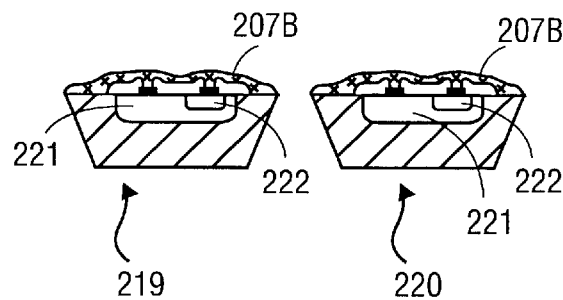

The structure shown in FIG. 4G is then further processed by removing the patterned layer 209 leaving the structure shown in FIG. 4H2 which is the same cross-sectional view as FIG. 4G. FIG. 4H1 also shows the same structure shown in FIG. 4H2, but from a top plane view. The cross-sectional view of FIG. 4H2 is also shown by the dashed line 4H2 in FIG. 4H1. Similarly, the cut for the cross-sectional view of FIG. 4G is shown in FIG. 4H1. Note that the patterned silicon nitride layer 207 remains over the blocks, such as block 207B and also remains over top portions of the trenches such as the remaining silicon nitride region 207A. At this point, the structure shown in FIG. 4H2 is exposed to an etchant which is designed to remove the layer 207 from the areas between the blocks so that the blocks are no longer joined by the layer 207 as they are as shown in FIG. 4H2. In one particular embodiment, where the patterned layer 207 is a silicon nitride, the etchant is preferably a hydrofluoric acid or hot phosphoric acid, and this etchant is used on the wafer for only enough time to complete the separation from the blocks but not so long that the circuit surface is exposed. The resulting structure is shown in FIG. 4H3 in which some of the silicon nitride layer remains over each of the blocks and their corresponding circuits but no longer remains covering each of the trenches 217A, 217B, and 217C. Then the structure remaining at this point as shown in FIG. 4H3 is processed to remove each of the blocks from the wafer by selectively etching the underlying layer 201. In one embodiment, since the underlying layer is a different layer than the epitaxial silicon layer 203, the underlying area can be etched by a process of converting the underlying area 201 to a porous silicon resulting in the structure shown in FIG. 4I in which the underlying layer 201 has been converted to a porous silicon 201A. Layer 201 is converted to porous silicon by the following process. This process turns p+ material into porous silicon (but not n− material). It is preferred to form the p+/n− epi junctions in the semiconductor wafer before the transistors are processed. The semiconductor wafer is contacted on its back to a current source and placed in a 1:1 49% HF:ethanol solution. The wafer is biased positive such that the current is approximately 4 mA per cm squared. Current is supplied for approximately 50 minutes which turns approximately 50 microns of layer 201 into porous silicon which may then be removed in a subsequent etch (e.g. a short etch in dilute KOH). For more information on porous silicon formation and etching see: Bell, T. E.; Gennissen, P. T. J.; DeMunter, D.; Kuhl, M.; Porous Silicon as a Sacrificial Material. *Journal of Micromechanics and Microengineering,* December 1996, vol. 6 (no. 4), pages 361–369. Then the structure shown in FIG. 4I may be exposed for about 3 minutes to a dilute KOH etch (e.g. 2% by weight solution) and a rinse in deionized water to release the blocks from the weakened substrate 201A. This results in the blocks being released which then can be collected in a sieve and placed in a fluid such as an alcohol in order to create a slurry. FIG. 4J shows an example of two blocks 219 and 220 which can be placed in a slurry for later processing and assembly into openings in a receiving substrate. It will be appreciated that FIG. 4J illustrates a simple example of a circuit in each block which in this case might be a diode created by an N-doped region 221 and a P-doped region 222, where each of those regions includes a contact pad for making contact to another electrical component through openings or vias in the layer 207B. It will be appreciated that many other alternative circuits or other functional components may be implemented in each of the blocks.

Figure 4K:
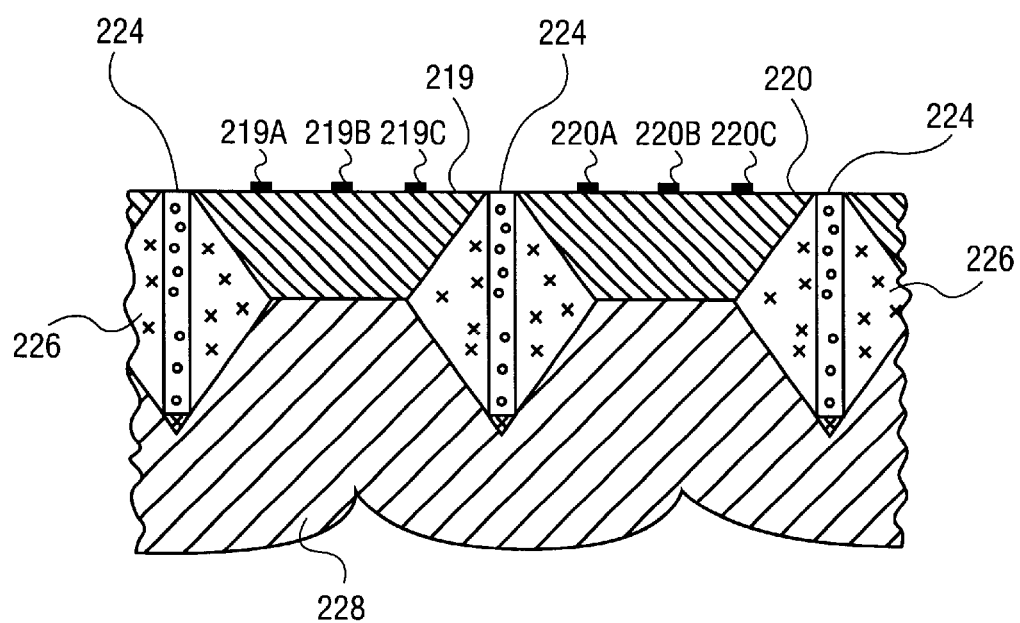

FIG. 4K shows a summary of the processing operations performed according to the method shown in FIGS. 4A through 4J. The layers 207 and 209 have been omitted from this figure. The reactive ion etched vertical trenches 224 are shown separating each block, such as blocks 219 and 220. Each block includes a plurality of contact or bonding pads, 219A through 219C in the case of block 219, and 220A through 220C in the case of block 220. The shape of each block is substantially determined by the diamond shaped trench region 226 which undercuts the blocks 219 and 220 and also slightly undercuts the vertical trench region. The porous silicon conversion process renders the underlying area 228 porous and therefore capable of being quickly and selectively etched away in order to release the blocks 219 and 220.

The various different methods of the present invention will typically create a plurality of elements which are designed to be received by an array of openings on a receiving substrate. Each of the plurality of elements typically includes at least one functional component, such as a pixel driving circuit for driving a liquid crystal cell in an active matrix liquid crystal display or other display driving elements for other types of displays. Co-pending U.S. patent application Ser. Nos. 09/251,220 and 09/251,268 filed Feb. 16, 1999 by John Stephen Smith and assigned to the same Assignee of the present invention, describe an example of the electrical circuitry disposed on each element which is to be assembled into an opening. These co-pending applications are hereby incorporated herein by reference. Generally, these elements resemble blocks having a trapezoidal cross-section where the top of the block is wider than the bottom of the block. An example of such a block is shown in FIG. 4J. Various improved methods for forming these openings are described in co-pending U.S. patent application Ser. No. 09/432,512, which was filed concurrently herewith by, inter alia, John Stephen Smith, Mark A. Hadley, Gordon S. W. Craig, and Frank Lowe, and which is assigned to the same Assignee as the present invention and which is entitled "Methods for Forming Openings in a Substrate and Apparatuses with these Openings and Methods for Creating Assemblies with Openings" and which is hereby incorporated herein by reference. In one preferred embodiment, the electrical circuits are fabricated as described in U.S. patent application Ser. Nos. 09/251,220 and 09/251,268 and are received by openings which are fabricated as described by the U.S. Patent Application entitled "Methods for Forming Openings in a Substrate and Apparatuses with these Openings and Methods for Creating Assemblies with Openings". FIGS. 9A through 9D will now be referred to in describing one example of a method of assembling the blocks into the openings in order to create a completed assembly.

FIG. 9A shows a generalized flowchart indicating the various processing operations which are performed to create the completed assembly in which the blocks or elements are assembled into the openings in the receiving substrate. In processing operation 301, blocks having a predetermined shape are prepared. In one particular example, an integrated circuit is fabricated into each block and each block is extracted from a first substrate which may be a single crystal semiconductor substrate, such as a mono-crystalline silicon wafer. Separately, in step 303, the openings for the blocks are prepared in a second substrate. Processing operation 303 may employ any of the methods described in the U.S Patent Application entitled "Methods for Forming Openings in a Substrate and Apparatuses with these Openings and Methods for Creating Assemblies with Openings" in order to form openings having a desired shape which is designed to match the predetermined shape of the blocks formed in processing operation 301. In step 305, the blocks are assembled into the openings.

In one example, the blocks may be assembled by a pick and place method as described above. In a preferred embodiment of the present invention, fluidic self assembly is used to assemble the blocks into the openings. Fluidic self assembly (FSA) in one example of the present invention may use a slurry of the blocks which are carried in the solvent, such as acetone or water with a surfactant. Agitation and fluid flow to move the blocks over the receiving surface may be used. When a block encounters an opening, it falls into it and is held there. Blocks that do not encounter an opening simply slide off the substrate. Eventually, the substrate contains only blocks that are in holes. If any empty holes remain on the substrate, a second dose of block slurry can be deposited on the substrate to fill those holes. Further aspects of FSA processes are described in the co-pending U.S. Patent application entitled "Methods for Forming Openings in a Substrate and Apparatuses with these Openings and Methods for Creating Assemblies with Openings."

In processing operation 307, the assembly is planarized. In one example, the substrate with the blocks is spin-coated with partially polymerized benzocyclobutine to a uniform thickness of greater than 2 microns. This planarization layer is then cured. FIG. 9B shows an example of a block, referred to as silicon block 325 having an active device layer 327 at the top surface of the block 325. The block sits securely in the opening 323 in the glass substrate 321. The planarization material is shown in FIG. 9C as material 329 which fills the gaps in the opening 323 and also coats the upper surface of the glass substrate 321 and covers the block 325 and the active circuit layer 327.

Vias are then etched in the planarization layer and electrical connections are made to bonding pads on the integrated circuit in the active circuit layer 327. Processing operation 309 as shown in FIG. 9A may include other methods for interconnecting the various blocks in the various openings along the substrate. In the case of an array of display elements, metalization is applied into the vias 331 in order to make contact to bonding pads on the active device layer 327 of the block 325. These patterned metal layers, such as metal lines 333A and 333B, serve to interconnect the blocks electrically. For example, these metal lines may represent a row line for a row of pixels or may represent a column line for a column of pixels as is well known in the art of fabricating active matrix liquid crystal displays.

While the foregoing description has provided examples of the present invention, it will be apparent that various modifications may be made within the spirit and scope of the invention which is limited only by the following claims. For example, the order of the processing operations may be modified and the same or similar result achieved in the resulting structure.

What is claimed is:

1. A method for creating elements having a predetermined shape, said method comprising:
fabricating in a first substrate a plurality of functional components in a plurality of elements, said functional components being disposed on a first face of said first substrate, said first substrate having two surfaces comprising said first face and a second face;
removing a layer representing a first portion of said first substrate at said second face leaving a second portion of said first substrate on said first substrate;
etching said second portion of said first substrate through a first patterned mask on a surface of said second portion;
releasing said plurality of elements from said first substrate.

2. A method as in claim 1 further comprising:
bonding said first face of said first substrate to a second substrate.

3. A method as in claim 1 wherein said etching said second portion exposes at least a portion of each of said plurality of elements and wherein each of said plurality elements comprises at least one functional component which comprises an electrical component.

4. A method as in claim 1 wherein said removing said layer comprises a mechanical process of one of grinding, lapping or polishing said first portion.

5. A method as in claim 1 wherein each of said plurality of elements is localized separately on said first face relative to other of said plurality of elements.

6. A method as in claim 1 wherein said first patterned mask is resistant to a KOH etch which etches said second portion.

7. A method as in claim 1 wherein each of said elements has a substantially quadrilateral cross section which is said predetermined shape which is designed to fit into an opening on a receiving substrate.

8. A method as in claim 1 further comprising:
cleaning said plurality of elements after said releasing of said plurality of elements.

9. A method as in claim 1 wherein each of said functional components comprises an electrical component for at least one of (a) a liquid crystal display pixel; (b) a light emitting diode display pixel; (c) a solar cell element; and (d) an electromagnetic signal detector.

10. A method as in claim 1 wherein said functional components are fabricated into said first face and a passivation layer is applied over said functional components and wherein a layer comprising tungsten is applied over said passivation layer and wherein said releasing comprises etching said layer comprises tungsten.

11. A method as in claim 1 wherein said first patterned mask is formed by aligning on said second face a plurality of shapes formed by said first patterned mask relative to functional components disposed on said first face.

12. A method as in claim 1 wherein said etching said second portion comprises first etching with an isotropic etchant and second etching with an anisotropic etchant.

13. A method as in claim 12 wherein said isotropic etchant comprises KOH and an oxidizer and said anisotropic etchant comprises KOH, and said second etching is after said first etching.

14. A method for creating elements having a predetermined shape, said method comprising:
fabricating in a first substrate a plurality of functional components in a plurality of elements, said functional components being disposed on a first face of said first substrate, said first substrate having two surfaces comprising said first face and a second face;
applying, after said fabricating, a release layer on said first face;
etching said second face to expose at least a portion of each of said plurality of elements;
etching said release layer.

15. A method for creating elements having a predetermined shape, said method comprising:
fabricating in a first substrate a plurality of functional components in a plurality of elements, said plurality of functional components being disposed on a first face of said substrate which also has a second face;
etching vertically, in a first etching process, regions of said first face which are adjacent to edges of said plurality of elements;

etching laterally, in a second etching process, regions below said first face which are adjacent to said edges;

releasing said plurality of elements from said first substrate.

16. A method as in claim 15 wherein said first substrate comprises a first layer which comprises said first face and a second layer which comprises said second face and wherein said first layer is disposed over said second layer and is resistant to a first etchant which is capable of etching said second layer and wherein said releasing comprises etching said second layer with said first etchant.

17. A method as in claim 16 wherein said first layer is an epitaxial layer comprising silicon and said second layer is a mono-crystalline silicon wafer, and wherein a thickness of said epitaxial layer determines a final depth of each of said plurality of elements.

18. A method as in claim 17 wherein said releasing further comprises converting said second layer to a porous silicon layer and said first etchant etches said porous silicon layer selectively relative to said first layer.

19. A method as in claim 18 wherein said first etchant is a dilute KOH etchant.

20. A method as in claim 16 wherein said etching vertically and said etching laterally are separate etchings, and wherein said etching laterally substantially determines said predetermined shape.

21. A method as in claim 15 wherein said releasing comprises etching a portion of said first substrate adjacent said second face.

22. A method as in claim 15 wherein said etching laterally substantially defines said predetermined shape and said etching vertically comprises etching through a first patterned mask and said etching laterally comprises etching separately after said etching vertically.

23. A method as in claim 22 wherein said first patterned mask comprises openings which do not extend beyond openings in said second patterned mask and wherein said openings in said first patterned mask and said openings in said second patterned mask to not extend to a plurality of corners of each of said plurality of elements, and wherein said first patterned mask is resistant to said etching vertically and said second patterned mask is resistant to etching laterally and said etching laterally comprises etching with said second patterned mask.

24. A method as in claim 22 wherein said etching vertically comprises a deep reactive ion etch and said etching laterally comprises a crystal orientation selective etch.

25. A method as in claim 24 wherein said etching vertically produces at least one trench and wherein said method further comprises:

etching a surface region on said first face between said trench and at least one of said corners.

26. A method for creating elements having a predetermined shape, said method comprising:

depositing a first layer into a second layer;

fabricating a plurality of functional components in a plurality of elements in said first layer;

etching at least said first layer to determine said predetermined shape for each of said plurality of elements;

etching said second layer such that a density of said second layer, after said etching of said second layer, is reduced;

releasing said plurality of elements from said second layer after said etching of said second layer.

27. A method as in claim 26 wherein said first layer comprises an epitaxial silicon semiconductor layer and said second layer comprises a silicon semiconductor wafer and wherein said releasing comprises etching said second layer.

28. A method as in claim 26 wherein a thickness of said first layer determines a depth of each of said plurality of elements.

* * * * *